(12) United States Patent
Demirlioglu et al.

(10) Patent No.: US 9,111,754 B2
(45) Date of Patent: *Aug. 18, 2015

(54) FLOATING GATE STRUCTURE WITH HIGH ELECTROSTATIC DISCHARGE PERFORMANCE

(75) Inventors: Esin Kutlu Demirlioglu, Cupertino, CA (US); Min-Yih Luo, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 493 days.

This patent is subject to a terminal disclaimer.

(21) Appl. No.: 11/655,493

(22) Filed: Jan. 18, 2007

(65) Prior Publication Data

US 2007/0236843 A1 Oct. 11, 2007

Related U.S. Application Data

(63) Continuation-in-part of application No. 11/190,682, filed on Jul. 26, 2005.

(60) Provisional application No. 60/760,081, filed on Jan. 18, 2006.

(51) Int. Cl.
| | |
|---|---|
| *H02H 9/00* | (2006.01) |
| *H01L 27/02* | (2006.01) |
| *H01L 29/06* | (2006.01) |
| *H02H 3/20* | (2006.01) |
| *H02H 3/22* | (2006.01) |

(Continued)

(52) U.S. Cl.
CPC .......... *H01L 27/027* (2013.01); *H01L 29/0626* (2013.01); *H01L 29/861* (2013.01); *H01L 2924/0002* (2013.01)

(58) Field of Classification Search
CPC .......................... H01L 27/027; H01L 29/086
USPC .................... 361/56, 111, 91.1, 91.5
See application file for complete search history.

(56) References Cited

U.S. PATENT DOCUMENTS

| | | | | |
|---|---|---|---|---|
| 4,922,371 | A | * 5/1990 | Gray et al. | 361/56 |
| 5,055,896 | A | 10/1991 | Williams et al. | |
| 5,072,266 | A | 12/1991 | Bulucea et al. | |

(Continued)

FOREIGN PATENT DOCUMENTS

| | | |
|---|---|---|
| EP | 0220789 | 5/1987 |
| EP | 0620588 | 10/1994 |

(Continued)

OTHER PUBLICATIONS

Aitchison, R. E., "Zener Diodes as Reference Sources in Transistor Regulated Power Supplies," Proceedings of the I.R.E. Australia, Jun. 1, 1959, pp. 350-352.

(Continued)

*Primary Examiner* — Thienvu Tran
*Assistant Examiner* — Lucy Thomas

(57) ABSTRACT

Systems and methods for floating gate structures with high electrostatic discharge performance. In one embodiment, a semiconductor structure includes a floating gate device. The floating gate device includes an embedded diode characterized as having less temperature dependence than a Zener diode. The breakdown voltage of the embedded diode is greater than an operating voltage of an associated integrated circuit and a snapback trigger voltage of the embedded diode is lower than a breakdown voltage of the semiconductor structure.

13 Claims, 4 Drawing Sheets

(51) Int. Cl.
*H01L 29/861* (2006.01)
*H01L 29/76* (2006.01)

(56) References Cited

U.S. PATENT DOCUMENTS

| | | | |
|---|---|---|---|
| 5,321,289 A | 6/1994 | Baba et al. | |
| 5,374,565 A | 12/1994 | Hsue et al. | |
| 5,416,036 A | 5/1995 | Hsue | |
| 5,416,351 A * | 5/1995 | Ito et al. | 257/357 |
| 5,430,315 A | 7/1995 | Rumennik | |
| 5,455,444 A | 10/1995 | Hsue | |
| 5,468,667 A | 11/1995 | Diaz et al. | |
| 5,496,751 A | 3/1996 | Wei et al. | |
| 5,500,547 A | 3/1996 | Yamaguchi et al. | |
| 5,502,320 A | 3/1996 | Yamada | |
| 5,519,242 A * | 5/1996 | Avery | 257/356 |
| 5,529,941 A | 6/1996 | Huang | |
| 5,545,909 A | 8/1996 | Williams et al. | |
| 5,547,880 A | 8/1996 | Williams et al. | |
| 5,559,352 A | 9/1996 | Hsue et al. | |
| 5,567,634 A | 10/1996 | Hebert et al. | |
| 5,581,104 A | 12/1996 | Lowrey et al. | |
| 5,585,299 A | 12/1996 | Hsu | |
| 5,637,898 A | 6/1997 | Baliga | |
| 5,637,900 A * | 6/1997 | Ker et al. | 257/355 |
| 5,643,820 A | 7/1997 | Williams et al. | |
| 5,648,283 A | 7/1997 | Tsang et al. | |
| 5,654,574 A | 8/1997 | Williams et al. | |
| 5,661,322 A | 8/1997 | Williams et al. | |
| 5,672,527 A | 9/1997 | Lee | |
| 5,674,761 A | 10/1997 | Chang et al. | |
| 5,677,205 A | 10/1997 | Williams et al. | |
| 5,733,794 A | 3/1998 | Gilbert et al. | |
| 5,850,095 A | 12/1998 | Chen et al. | |
| 5,877,534 A | 3/1999 | Williams et al. | |
| 5,932,916 A | 8/1999 | Jung | |
| 5,953,601 A | 9/1999 | Shiue et al. | |
| 5,998,833 A | 12/1999 | Baliga | |
| 5,998,836 A | 12/1999 | Williams | |
| 5,998,837 A | 12/1999 | Williams | |
| 6,044,018 A * | 3/2000 | Sung et al. | 365/185.18 |
| 6,046,470 A | 4/2000 | Williams et al. | |
| 6,049,108 A | 4/2000 | Williams et al. | |
| 6,060,752 A | 5/2000 | Williams | |
| 6,078,090 A | 6/2000 | Williams et al. | |
| 6,140,678 A | 10/2000 | Grabowski et al. | |
| 6,168,996 B1 | 1/2001 | Numazawa et al. | |
| 6,211,018 B1 | 4/2001 | Nam et al. | |
| 6,255,683 B1 | 7/2001 | Radens et al. | |
| 6,268,242 B1 | 7/2001 | Williams et al. | |
| 6,277,695 B1 | 8/2001 | Williams et al. | |
| 6,347,026 B1 | 2/2002 | Sung et al. | |
| 6,365,462 B2 | 4/2002 | Baliga | |
| 6,365,941 B1 | 4/2002 | Rhee | |
| 6,368,922 B1 | 4/2002 | Yu | |
| 6,391,721 B2 | 5/2002 | Nakagawa | |
| 6,413,822 B2 | 7/2002 | Williams et al. | |
| 6,514,839 B1 * | 2/2003 | Ker et al. | 438/514 |
| 6,548,860 B1 | 4/2003 | Hshieh et al. | |
| 6,631,060 B2 | 10/2003 | Su et al. | |
| 6,642,109 B2 | 11/2003 | Lee et al. | |
| 6,645,802 B1 | 11/2003 | Li et al. | |
| 6,661,054 B1 | 12/2003 | Nakamura | |
| 6,680,833 B1 | 1/2004 | Morishita | |
| 6,700,158 B1 | 3/2004 | Cao et al. | |
| 6,815,775 B2 | 11/2004 | Ker et al. | |
| 6,855,593 B2 | 2/2005 | Andoh et al. | |
| 6,861,701 B2 | 3/2005 | Williams et al. | |
| 6,919,603 B2 | 7/2005 | Brodsky et al. | |
| 6,927,455 B2 | 8/2005 | Narazaki | |
| 7,019,368 B1 | 3/2006 | McCollum et al. | |
| 7,419,878 B2 | 9/2008 | Williams et al. | |
| 7,482,218 B1 | 1/2009 | McCollum et al. | |
| 7,544,545 B2 | 6/2009 | Chen et al. | |
| 7,583,485 B1 | 9/2009 | Luo et al. | |
| 7,612,431 B2 | 11/2009 | Chen et al. | |
| 7,642,164 B1 | 1/2010 | Xu et al. | |
| 7,781,826 B2 * | 8/2010 | Mallikarjunaswamy et al. | 257/328 |
| 8,072,013 B1 | 12/2011 | Chen et al. | |
| 8,367,500 B1 | 2/2013 | Xu et al. | |
| 8,582,258 B1 | 11/2013 | Luo et al. | |
| 8,629,019 B2 | 1/2014 | Xu et al. | |
| 2002/0030231 A1 | 3/2002 | Okawa et al. | |
| 2002/0063289 A1 | 5/2002 | Su et al. | |
| 2002/0074585 A1 | 6/2002 | Tsang et al. | |
| 2003/0030092 A1 | 2/2003 | Darwish et al. | |
| 2003/0071310 A1 | 4/2003 | Salling et al. | |
| 2004/0075145 A1 | 4/2004 | Shibib | |
| 2004/0124472 A1 * | 7/2004 | Lin et al. | 257/355 |
| 2005/0036251 A1 | 2/2005 | Mallikarjunaswamy et al. | |
| 2005/0275054 A1 | 12/2005 | Berndlmaier et al. | |
| 2006/0208340 A1 * | 9/2006 | Glenn et al. | 257/603 |
| 2006/0268479 A1 * | 11/2006 | Bischof | 361/56 |

FOREIGN PATENT DOCUMENTS

| | | |
|---|---|---|
| EP | 1186023 | 3/2002 |
| EP | 1351313 | 10/2003 |
| EP | 1403914 | 3/2004 |
| JP | S62-279677 | 3/1987 |
| JP | 63-081984 | 4/1988 |
| JP | 05090520 | 4/1993 |
| JP | H06-350090 | 12/1994 |
| JP | 7202129 | 8/1995 |
| JP | 7273320 | 10/1995 |
| JP | 09-129877 | 5/1997 |
| JP | 10335486 | * 12/1998 |
| JP | 2000091344 | 3/2000 |
| JP | 2000156421 | 6/2000 |
| JP | 2001077314 | 3/2001 |
| JP | 2001257349 | 9/2001 |
| JP | 2002208677 | 7/2002 |
| JP | 2002246596 | 8/2002 |
| JP | 2002270841 | 9/2002 |
| JP | 20020016080 | 9/2002 |
| JP | 20020110978 | 10/2003 |
| JP | 2002-274640 | 4/2004 |
| JP | 2004134793 | 4/2004 |
| JP | 2004247455 | 9/2004 |
| JP | 2005520349 | 7/2005 |
| JP | 2011233641 | 11/2011 |
| KR | 1019990024045 | 3/1993 |
| TW | 1221033 | 9/2004 |
| TW | 1225281 | 12/2004 |
| TW | 1231988 | 5/2005 |

OTHER PUBLICATIONS

Bett, N., "Diret-voltage References," PROC. IEE, vol. 122, No. 10R, Oct. 1, 1975, pp. 1071-1076.

* cited by examiner

FLOATING GATE STRUCTURE WITH HIGH ELECTROSTATIC DISCHARGE PERFORMANCE

RELATED APPLICATIONS

This Application claims priority to U.S. Provisional Application No. 60/760,081, filed Jan. 18, 2006, entitled "Low Voltage Output Driver with High Performance Electrostatic Discharge Performance" to Luo and Demirlioglu, which is incorporated herein in its entirety by reference for all purposes.

This Application is a Continuation In Part of co-pending, commonly owned U.S. patent application Ser. No. 11/190,682, filed Jul. 26, 2005, to Luo et al., entitled "Electrostatic Discharge Protection Circuit for Integrated Circuits," which is incorporated herein in its entirety by reference for all purposes.

FIELD OF INVENTION

Embodiments of the present invention relate to the field of integrated circuits. More specifically, embodiments of the present invention pertain to electrostatic discharge (ESD) protection for integrated circuits.

BACKGROUND

An electrostatic discharge (ESD) event occurs when there is a transfer of energy between bodies that have different electrostatic potentials, either through contact or through an ionized ambient discharge. Integrated circuits (ICs) with inadequate ESD protection are subject to catastrophic failure, including, e.g., ruptured passivation, electrothermal migration, splattered aluminum, contact spiking, dielectric failure and the like. Alternatively, an ESD event can damage a device even though the device continues to function. Damage of this type constitutes latent defects, which are hard to detect and significantly shorten the life of such damaged ICs.

Under the conventional art, it is common to rely on the physical and electrical size of output (e.g., off-chip) driver circuits, to provide electrostatic discharge protection. The output driver itself generally provides for enhanced ESD protection through the use of a large total width of a multiple-finger structure and a wide contact-to-poly spacing.

However, the effectiveness of this conventional approach to electrostatic discharge protection has been decreasing as integrated circuit technology advances. The general trend of ever smaller device geometry and decreasing circuit area favors a decreasing chip size. Accordingly, the die area available for output circuits continues to decrease, which lessens the ESD absorption/mitigation capabilities of such output circuits.

Unfortunately, there is a growing need for even higher levels of electrostatic discharge protection than before. This promotes use of an independent ESD device in parallel with the output driver for ESD protection.

In general, the gate of an output driver is connected to an internal circuit, e.g., to receive the signal to be output. This form of connection generally makes the output device snapback much faster in response to an ESD event than if the gate of the output driver was grounded. In order to fully protect the output driver, a separate ESD device must have a trigger voltage lower than a breakdown voltage of the output driver, as well as having an ultra-low on-resistance even in a high ESD current regime.

As used herein, the term breakdown voltage refers to both oxide breakdown voltage as well as junction breakdown voltage. In general, the lower of these two voltages is a point at which an integrated circuit fails to operate, and actual physical damage may occur. Either of these voltages may be lower than the other (in magnitude) depending upon a wide variety of construction and process variables.

An ESD protection device should also have a holding voltage greater than the maximum operating voltage of the circuit to prevent the circuit from turning on during an ESD event. Otherwise the circuit may be permanently damaged due to high ESD currents that cannot be sustained by the circuit itself. When the snapback trigger voltage is greater than a breakdown voltage, damage to the integrated circuit can occur if an ESD event causes a voltage that is greater than the lowest breakdown voltage.

IC manufacturers attempt to design metal oxide semiconductor field effect transistors (MOSFETs) that have a desirable relationship between snapback trigger voltage and snapback holding voltage for use in ESD protection devices for IC applications. However, these parameters are constrained by the IC manufacturing process and by circuit performance considerations. Thus, an optimal combination of snapback trigger voltage and snapback holding voltage is not always available.

SUMMARY OF THE INVENTION

Therefore, a need exists for systems and methods for floating gate structures with high electrostatic discharge performance. A need also exists for systems and methods for a desirable combination of snapback trigger voltage and snapback holding voltage that also satisfies the above need. A further need exists for systems and methods for floating gate structures with high electrostatic discharge performance that is compatible and complementary with existing systems and methods of integrated circuit design and manufacturing. Embodiments in accordance with the present invention provide for these needs.

Embodiments in accordance with the present invention embed a diode device into a floating gate electrostatic discharge protection structure.

Accordingly, systems and methods for floating gate structures with high electrostatic discharge performance are disclosed. In one embodiment, a semiconductor structure includes a floating field gate device. The floating gate device includes an embedded diode characterized as having less temperature dependence than a Zener diode. The breakdown voltage of the embedded diode may be, greater than an operating voltage of an associated integrated circuit and a snapback trigger voltage of the embedded diode is lower than a breakdown voltage of the semiconductor structure.

In accordance with another embodiment of the present invention, a semiconductor structure for electrostatic discharge protection includes a plurality of first fingers coupled to an output pad and a plurality of second fingers interlaced between the first fingers and coupled to a ground pad. The semiconductor structure further includes a plurality of floating gates interposed between the first and second fingers. The first fingers comprise an embedded hybrid diode characterized as having a diode breakdown voltage lower than a breakdown voltage of the semiconductor structure and a snapback trigger voltage less than the breakdown voltage of the semiconductor structure.

In accordance with an alternative embodiment of the present invention, a semiconductor structure includes a circuit for driving an off-chip output. The circuit includes a pull-down device. The semiconductor structure further includes a hybrid diode device embedded in the circuit characterized as having a trigger voltage below a breakdown voltage of the pull-down device.

In accordance with yet another embodiment of the present invention, an electrostatic discharge (ESD) protection circuit for an integrated circuit (IC) for providing protection during an ESD event includes a current flow control component and a current flow direction control component coupled in series to the current flow control component. The snapback holding voltage of the electrostatic discharge protection circuit is greater than an operating voltage of the integrated circuit and a snapback trigger voltage of the electrostatic discharge protection circuit is lower than an oxide breakdown voltage of the IC.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Floating Gate Structure with High Electrostatic Discharge Performance

Under the conventional art, a diode, e.g., a Zener diode, may be utilized along side an output driver circuit to provide enhanced electrostatic discharge performance. Conventionally, such a diode was a separate circuit in addition to the output driver circuit. Embodiments in accordance with the present invention form an embedded diode at the emitter or source of a floating gate ESD protection structure, e.g., such a diode is part of the floating gate ESD protection structure, in contrast to the conventional art method of utilizing a separate diode. The embedded diode leads to a sharp decrease in trigger voltage (Vtrig), and a drastic increase in substrate current (Isub) responsive to positive electrostatic discharges. The large substrate current enhances the electron injection from the emitter or source, leading to a reduction in the on-resistance due to conductivity modulation.

However, this benefit may be offset by a detrimental increase in the Gummel number of the device as the deep p+ implant is performed. To improve this, the diode may be formed in a multiple-finger ESD device with a floating gate. It is appreciated that the term "floating gate" does not exclude a gate comprising polysilicon. In this case, the on-resistance may be reduced down to the order of tenths of an ohm. Therefore, this novel ESD structure is well suited for low-voltage output protection and enables human body model (HBM) ESD failure thresholds greater than 9 kV.

Figure 1A:
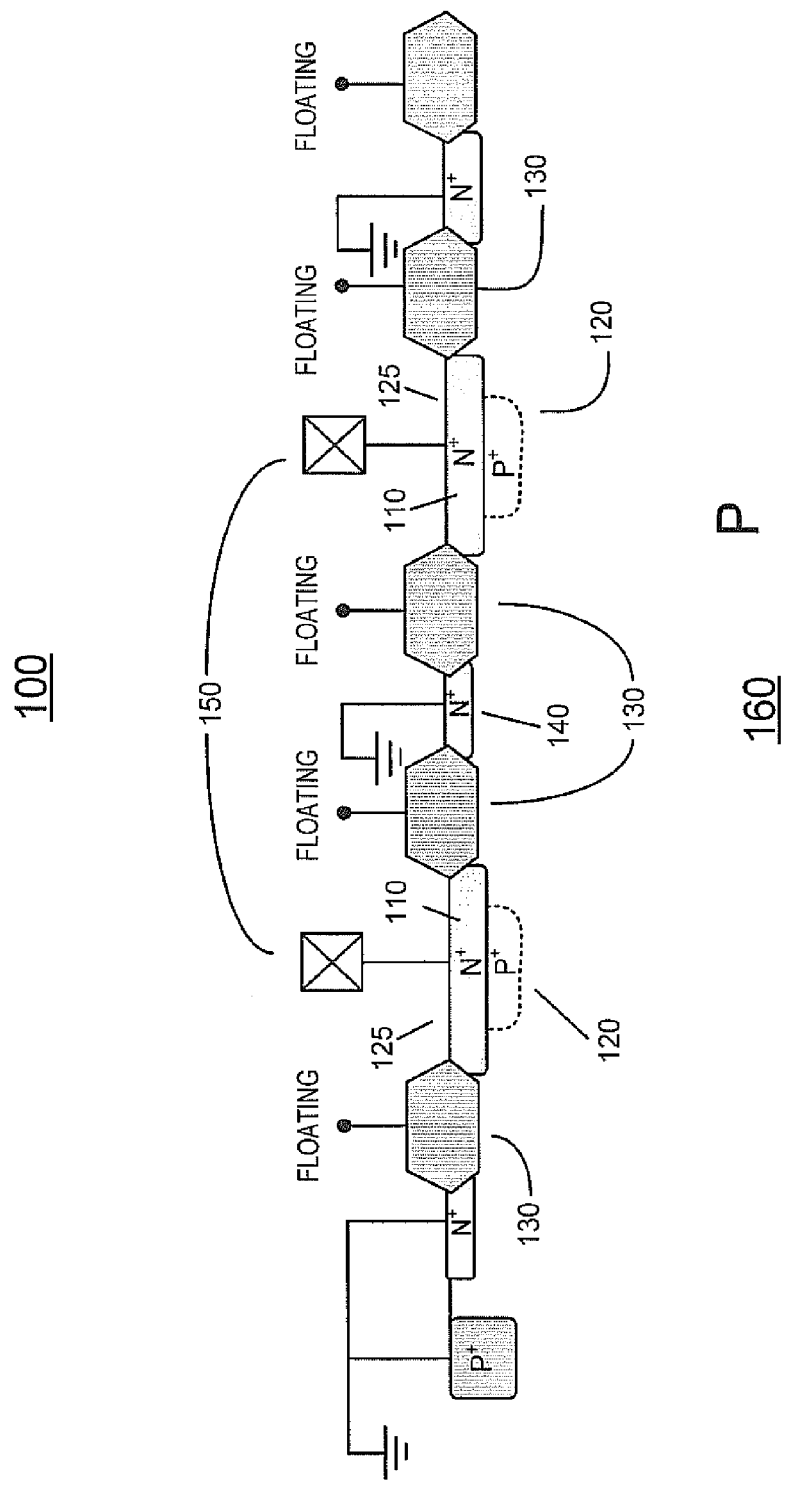
FIG. 1A illustrates a side sectional view of a portion of an exemplary low voltage output driver circuit with high electrostatic discharge performance, in accordance with embodiments of the present invention.

FIG. 1A illustrates a side sectional view of a portion of a floating gate structure 100 with high electrostatic discharge performance, in accordance with embodiments of the present invention. For example, floating gate structure 100 may be formed as part of a source and/or emitter of a floating gate ESD protection structure. Floating gate structure 100 may, for example, be formed in p type material 160. P type material 160 may be a p well, an epitaxial layer or a bulk substrate. In general, p type material 160 will be at the same potential as the substrate. As may be seen in FIG. 2, below, the structures illustrated in FIG. 1 have substantial extent above and below the sectional plane of FIG. 1, e.g., they extend into and out of the paper.

It is appreciated that embodiments in accordance with the present invention are well suited to formation in n type materials as well. Due to the well known duality of semiconductor structures, one of ordinary skill in the art may exchange n type conduction for p type conduction to produce alternative embodiments of the present invention. Such variations are considered within the scope of the present invention.

Floating gate structure 100 comprises a plurality of stacks 125 of n++ region 110 disposed over p+ junction 120. The n++ regions 110 of stack 125 are coupled to output pad 150, which may comprise passivated metal, typically for coupling to an external pin of an integrated circuit package.

A plurality of floating gates 130, e.g., field oxide, is adjacent to either side (in this view) of stacks 125. On the other side of floating gates 130, e.g., the side opposite from stack 125, is a grounded region 140 of n type material. Thus floating gate structure 100 comprises multiple instances of a floating gate 130, a stack 125, a floating gate 130 and ground region 140.

As another way of viewing floating gate structure 100 in the view of FIG. 1, stack 125 has two adjacent floating gates 130. Each ground region 140 has two adjacent floating gates 130. Each floating gate 130 has a stack 125 on one side and a ground region 140 on the other side.

It is to be appreciated that an instance of n++ region 110, floating gate 130 and n+ region 140, in conjunction with p type material 160, forms a p channel field effect transistor. Such a device may be used to couple output pad 150 to ground, e.g., to pull down the output terminal.

Figure 1B:
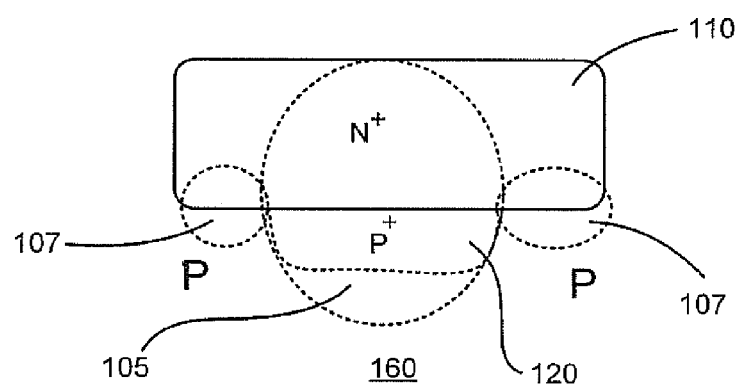
FIG. 1B is a detail view of an instance of a stack structure, in accordance with embodiments of the present invention.

FIG. 1B is a detail view of an instance of stack 125, in accordance with embodiments of the present invention. Stack 125 comprises region 110 of n++ material disposed over region 120 of p+ material. It is to be appreciated that region 110 extends beyond (horizontally, in the view of FIG. 1B) region 120. For example, region 110 also contacts p type material 160.

It is to be further appreciated that stack 125 forms two different types of diodes. Diode 107 is formed between n++ region 110, acting as a cathode, and p type material 160, acting as an anode. Diode 107 is a p/n type diode with a positive temperature coefficient. Diode 105 is formed between n++ region 110, acting as a cathode, and p+ junction 120, acting as an anode. Diode 105 is a Zener type diode with a negative temperature coefficient. The Zener diode 105 generally has a lower trigger voltage than a pull down transistor formed by instance of n++ region 110, floating gate 130 and n+ region 140, in conjunction with p type material 160.

By combining two types of diodes with opposite temperature coefficients, e.g., a diode with a positive temperature coefficient and a diode with a negative temperature coefficient, stack 125 forms a novel hybrid diode structure with substantially less (in magnitude) temperature variation than diodes of the conventional art. The area of diode 107 should be about equal to the area of diode 105, depending upon doping concentrations, resistance, and the like. It is appreciated that other temperature coefficients for the novel hybrid diode may be desirable in alternative embodiments in accordance with the present invention, and that such other temperature coefficients may be achieved by forming differing ratios of diode areas.

It is to be appreciated that the diode breakdown voltage of floating gate structure 100 may be adjusted via well known variations in doping concentrations and the like. Further, the diode breakdown voltage may be constructed so that it is different that a breakdown voltage of an associated integrated circuit, e.g., an integrated circuit protected by floating gate structure 100. Such diode breakdown voltage(s) should be less than the breakdown voltage(s) of the associated integrated circuits.

Figure 2A:
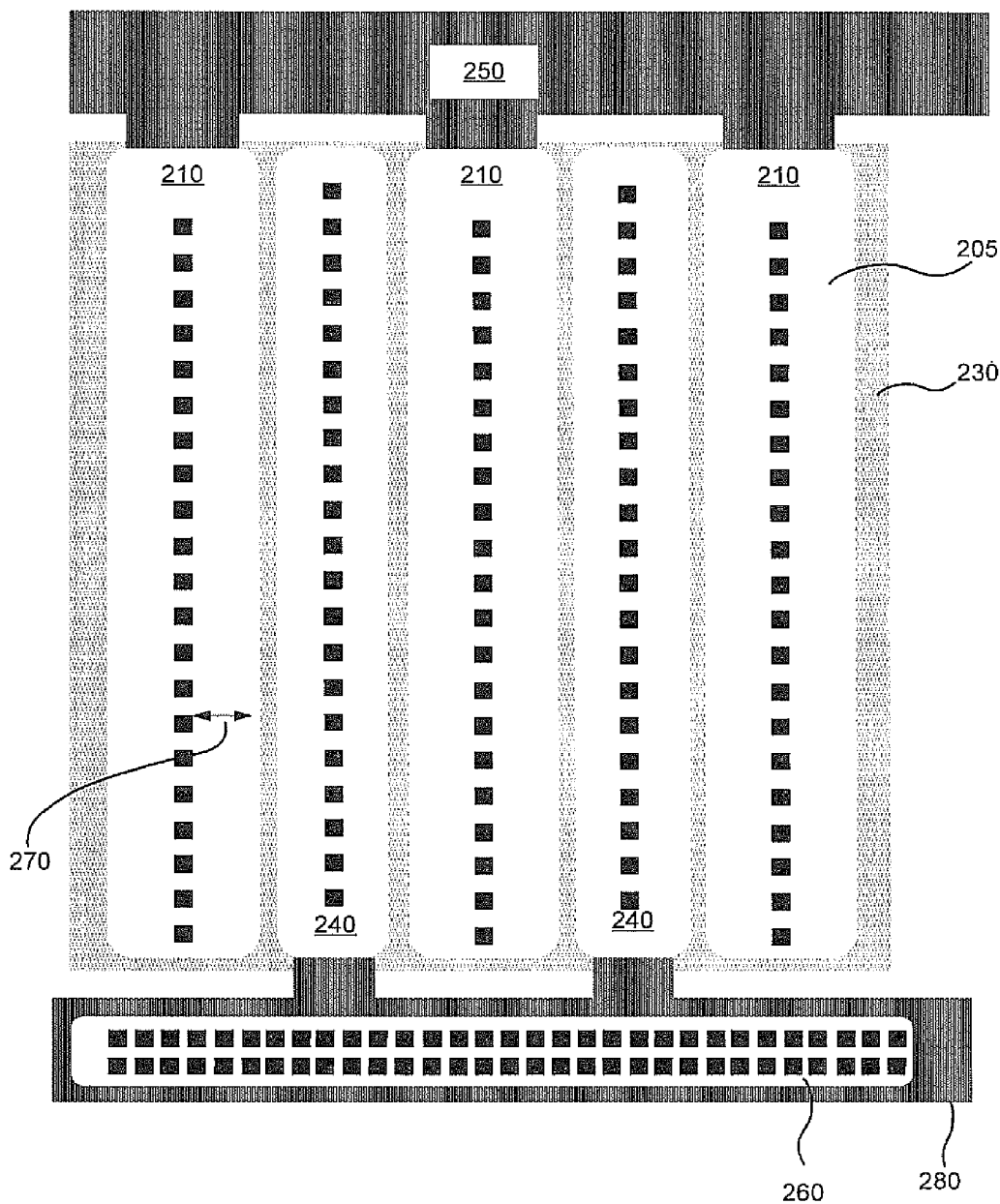
FIG. 2A illustrates a plan view of a portion of exemplary low voltage output driver floating gate structure 200 with high electrostatic discharge performance, in accordance with embodiments of the present invention.

FIG. 2A illustrates a plan view of a portion of exemplary floating gate structure 200 with high electrostatic discharge performance, in accordance with embodiments of the present invention. Floating gate structure 200 is generally analogous to floating gate structure 100 of FIG. 1A, although fewer elements are illustrated.

Floating gate structure 200 comprises output pad 250, which may comprise passivated metal, typically for coupling to an external pin of an integrated circuit package. Fingers of output pad 250 run down (in the view of FIG. 2) over regions of n++ material 210. The full extent of the fingers are not shown so as to illustrate features underneath. The n++ material 210 is disposed over regions of p+ material (obscured in the view of FIG. 2), as illustrated in FIG. 1. As a beneficial result, regions 210 in conjunction with the underlying regions of p+ material and p type material (not shown) form a novel hybrid diode structure with a small temperature coefficient, as described previously with respect to FIG. 1B.

Region 260 is a ground pad of p+ material disposed over metal 280. Fingers of region 280 run up (in the view of FIG. 2) and over n type ground regions 240. The full extent of the fingers are not shown so as to illustrate features underneath. Ground pad 260 picks up ground from the p well, epitaxial layer or bulk substrate. Floating gates 230 are interposed between the fingers 210 and fingers 240.

The width (in the view of FIG. 2) of features 210 plays an important role in the electrostatic discharge performance of output driver floating gate structure 200. Higher ESD resistance favors a larger width, especially a larger separation 270 between contacts and the floating gates 230. In contrast, die area considerations favor a smaller separation 270. In an exemplary BiCMOS twin well, dual gate 0.3 μm process, a separation 270 of about 3 to 5 μm was found to be optimal. It is appreciated that such separation is generally much larger than the minimum design rule for contact separation for a given process.

Floating gate structure 200 exhibits a snapback holding voltage that is greater than the operating voltage of the hybrid diode 125 (FIG. 1B) and a snapback trigger voltage that is lower than that required to cause damage to the host integrated circuit. This electronic arrangement avoids latch up due to the snapback holding voltage being lower than the hybrid diode 125 operating voltage and IC damage due to the snapback trigger voltage being too high.

The use of an embedded hybrid diode 125 may ensure that part of the holding voltage is sustained by the hybrid diode in conduction mode such that the remaining holding voltage is insufficient to cause latchup. As a result, during an ESD event the floating gate structure 200, including hybrid diode 125, may drain the ESD induced current, hence serving as an ESD protection device for an associated integrated circuit (IC). After the ESD event, the operating voltage cannot sustain the conduction mode, forcing the hybrid diode off, thereby protecting the floating gate structure 200 and an associated integrated circuit from damage.

Figure 2B:
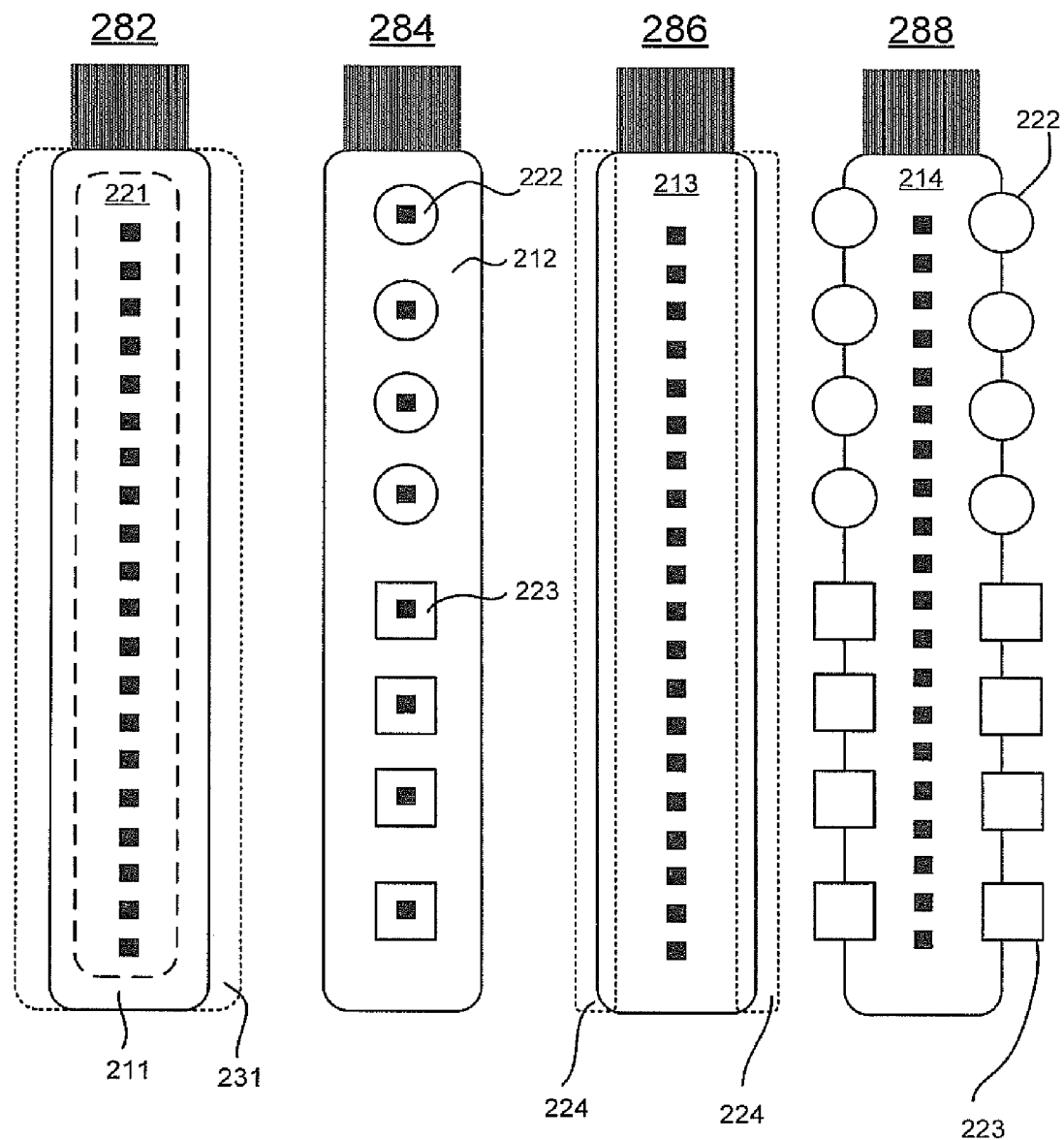
FIG. 2B illustrates a variety of alternative layouts of an embedded hybrid diode, in accordance with embodiments of the present invention.

FIG. 2B illustrates a variety of alternative layouts of an embedded hybrid diode, in accordance with embodiments of the present invention. In layout alternative 282, floating gate 231 underlies n++ material 211. P+ material 221 is disposed above n++ material 211.

In layout alternative 284, a plurality of p+ "islands" 222 and 223 overlay n++ material 212. The p+ islands 222 and 223 may take a variety of shapes, including, but not limited to the illustrated circles and squares. In layout alternative 286, "strips" of p+ material 224 are formed near the edges of n++ material 213. For example, strips 224 may be above or below the plane of material 213.

In yet another alternative layout 288, islands of p+ material, e.g., islands 222 and/or 223, are formed near the edges of n++ material 214. These and other layout alternatives may be utilized to vary the characteristics of the novel embedded diode, in accordance with embodiments of the present invention.

Embodiments in accordance with the present invention provide for systems and methods for floating gate structures with high electrostatic discharge performance. Embodiments in accordance with the present invention provide also provide for a desirable combination of snapback trigger voltage and snapback holding voltage. Further, embodiments in accordance with the present invention provide for systems and methods for forming floating gate structures with high electrostatic discharge performance that is compatible and complementary with existing systems and methods of integrated circuit design and manufacturing.

Various embodiments of the invention are thus described. While the present invention has been described in particular embodiments, it should be appreciated that the invention should not be construed as limited by such embodiments, but rather construed according to the below claims.

What is claimed is:
1. A semiconductor structure comprising:
   a first floating gate, a second floating gate, and a stack structure including a first type of diode and a second type of diode, wherein said first and second floating gates are located on opposite sides of said stack structure, and wherein said stack structure further includes a semiconductor layer of a first doping type and a plurality of semiconductor regions of a second doping type and of a first doping concentration located on and overlaying a top surface of said semiconductor layer and located inside a top surface boundary of said semiconductor layer.

2. A semiconductor structure of claim 1 wherein said first type of diode comprises a p/n type diode.

3. A semiconductor structure of claim 2 wherein said second type of diode comprises a Zener diode.

4. A semiconductor structure of claim 3 wherein said p/n type diode and said Zener diode comprise a common cathode.

5. A semiconductor structure for electrostatic discharge protection comprising:
 a plurality of first fingers coupled to an output pad;
 a plurality of second fingers interlaced between said first fingers and coupled to a ground pad;
 a plurality of floating gates interposed between said first and second fingers; and
 wherein said first fingers comprise a stack structure including a first type of diode and a second type of diode, wherein first and second floating gates are located on opposite sides of said stack structure, and wherein said stack structure further includes a semiconductor layer of a first doping type and a plurality of semiconductor regions of a second doping type and of a first doping concentration located on and overlaying a top surface of said semiconductor layer and located inside a top surface boundary of said semiconductor layer.

6. A semiconductor structure of claim 5 wherein said second type of diode comprises a Zener diode.

7. A semiconductor structure of claim 6 wherein said first type of diode comprises a p/n diode.

8. A semiconductor structure of claim 7 wherein said p/n diode comprises a well of anode material.

9. A semiconductor structure of claim 7 wherein said Zener diode and said p/n diode comprise a common cathode.

10. A semiconductor structure comprising:
 a circuit for driving an off-chip output;
 wherein said circuit comprises a pull-down device, a first floating gate, a second floating gate, and a stack structure including a first type of diode and a second type of diode, wherein said first and second floating gates are located on opposite sides of said stack structure, and wherein said stack structure further includes a semiconductor layer of a first doping type and a plurality of semiconductor regions of a second doping type and of a first doping concentration located on and overlaying a top surface of said semiconductor layer and located inside a top surface boundary of said semiconductor layer.

11. An electrostatic discharge (ESD) protection circuit for an integrated circuit (IC) for providing protection during an ESD event, said circuit comprising:
 a current flow control component; and
 a current flow direction control component coupled in series to said current flow control component, wherein said current flow direction control component comprises a first floating gate, a second floating gate, and a stack structure including a first type of diode and a second type of diode, wherein said first and second floating gates are located on opposite sides of said stack structure, and wherein said stack structure further includes a semiconductor layer of a first doping type and a plurality of semiconductor regions of a second doping type and of a first doping concentration located on and overlaying a top surface of said semiconductor layer and located inside a top surface boundary of said semiconductor layer.

12. The ESD protection circuit of claim 11 wherein said current flow control component is a transistor.

13. The ESD protection circuit of claim 12 wherein said transistor is a MOSFET.

* * * * *